(12) United States Patent
Shih

(10) Patent No.: US 11,052,399 B2
(45) Date of Patent: Jul. 6, 2021

(54) POWDER GATHERING APPARATUS

(71) Applicant: Elite Material Co., Ltd., Taoyuan (TW)

(72) Inventor: Hui-Ting Shih, Taoyuan (TW)

(73) Assignee: Elite Material Co., Ltd., Taoyuan (TW)

(*) Notice: Subject to any disclaimer, the term of this patent is extended or adjusted under 35 U.S.C. 154(b) by 500 days.

(21) Appl. No.: 15/834,081

(22) Filed: Dec. 7, 2017

(65) Prior Publication Data

US 2019/0143335 A1     May 16, 2019

(30) Foreign Application Priority Data

Nov. 10, 2017    (TW) ................................ 106138877

(51) Int. Cl.
| | |
|---|---|
| B02C 7/02 | (2006.01) |
| B02C 7/12 | (2006.01) |
| B02C 7/14 | (2006.01) |
| B02C 23/20 | (2006.01) |
| B02C 23/10 | (2006.01) |
| H05K 3/22 | (2006.01) |

(52) U.S. Cl.
CPC ............... *B02C 7/02* (2013.01); *B02C 7/12* (2013.01); *B02C 7/14* (2013.01); *B02C 23/10* (2013.01); *B02C 23/20* (2013.01); *H05K 3/22* (2013.01); *H05K 2203/0195* (2013.01); *H05K 2203/178* (2013.01)

(58) Field of Classification Search
CPC .... B02C 7/02; B02C 7/04; B02C 7/12; B02C 7/14; B02C 7/06
USPC ........................................ 451/261, 262, 278
See application file for complete search history.

(56) References Cited

U.S. PATENT DOCUMENTS

| | | | | |
|---|---|---|---|---|
| 2,329,995 | A * | 9/1943 | Koether | B24D 7/10 451/53 |
| 3,121,982 | A * | 2/1964 | Miller | B24D 7/06 451/548 |
| 4,106,915 | A * | 8/1978 | Kagawa | B24D 3/32 451/41 |
| 5,062,177 | A * | 11/1991 | Huhmann | A46B 13/02 15/49.1 |
| 5,632,790 | A * | 5/1997 | Wiand | B24B 7/22 51/293 |
| 5,827,112 | A * | 10/1998 | Ball | B24B 7/228 451/21 |
| 5,938,510 | A * | 8/1999 | Takahashi | B08B 1/04 451/290 |
| 6,638,144 | B2 * | 10/2003 | Sventek | B24B 1/00 451/36 |
| 2001/0034189 | A1 * | 10/2001 | Herrman | B24B 7/17 451/41 |

(Continued)

*Primary Examiner* — Adam J Eiseman
*Assistant Examiner* — Stephen Floyd London
(74) *Attorney, Agent, or Firm* — Winston Hsu

(57) ABSTRACT

A powder gathering apparatus includes at least two rotating plates and a driving mechanism. The at least two rotating plates are disposed with respect to each other. Each of the rotating plates includes at least one spherical member. The at least one spherical member protrudes from the rotating plate. The driving mechanism drives at least one of the at least two rotating plates to move, such that the at least two rotating plates get close to or away from each other. The driving mechanism drives the at least two rotating plates to rotate.

16 Claims, 12 Drawing Sheets

(56) References Cited

U.S. PATENT DOCUMENTS

| | | | |
|---|---|---|---|
| 2006/0128285 A1* | 6/2006 | Eklund | B24B 3/54 |
| | | | 451/261 |
| 2006/0237395 A1* | 10/2006 | Yamada | B24B 7/17 |
| | | | 219/69.17 |
| 2007/0232207 A1* | 10/2007 | Palushi | B24B 7/186 |
| | | | 451/350 |
| 2009/0042487 A1* | 2/2009 | Tokura | B24B 49/16 |
| | | | 451/41 |
| 2009/0104858 A1* | 4/2009 | Yamamoto | B24B 37/042 |
| | | | 451/259 |
| 2012/0071064 A1* | 3/2012 | Hashii | B24B 37/245 |
| | | | 451/41 |
| 2018/0015588 A1* | 1/2018 | Rogers | B24B 7/186 |

* cited by examiner

POWDER GATHERING APPARATUS

BACKGROUND OF THE INVENTION

1. Field of the Invention

The invention relates to a powder gathering apparatus and, more particularly, to a powder gathering apparatus configured to gather powders from a prepreg or a copper-free laminate.

2. Description of the Prior Art

A copper clad laminate and a prepreg are raw materials for manufacturing a printed circuit board (PCB), wherein the prepreg is made by impregnating a reinforcing fiber fabric with a resin composition and then curing the resin composition to form a B-stage prepreg. The copper clad laminate is made by stacking and laminating two copper foils with at least one B-stage prepreg under vacuum, high temperature and high pressure conditions. Consequently, the resin composition is cured to form an insulating layer, also called C-stage, of the copper clad laminate.

When manufacturing the prepreg, the conversion rate of the resin composition in B-stage needs to be inspected, so as to estimate the characteristic of the prepreg. In the prior art, the prepreg is rubbed manually to make the B-stage resin composition come off the prepreg to obtain B-stage powders. As to the copper-free laminate, the prior art etches the copper foil outside the copper clad laminate first and then uses a blade to scrape the C-stage resin composition from the surface of the copper-free laminate to obtain C-stage powders. After gathering the B-stage or C-stage powders, the prior art can inspect the characteristic of the powders by specific equipment accordingly. The aforesaid manners of gathering powders from the prepreg or the copper-free laminate waste much manpower and cannot gather powders efficiently. Therefore, how to gather powders from the prepreg or the copper-free laminate automatically and efficiently becomes a significant issue.

SUMMARY OF THE INVENTION

An objective of the invention is to provide a powder gathering apparatus configured to gather powders from a prepreg or a copper-free laminate, so as to solve the aforesaid problems.

According to the claimed invention, a powder gathering apparatus comprises at least two rotating plates disposed with respect to each other, each of the rotating plates comprising at least one spherical member, the at least one spherical member protruding from the rotating plate; and a driving mechanism driving at least one of the at least two rotating plates to move, such that the at least two rotating plates get close to or away from each other, the driving mechanism driving the at least two rotating plates to rotate. The driving mechanism comprises at least one component capable of implementing the aforesaid function, such as, but not limited to, control unit, control rod, motor, gear, driving belt, roller (e.g. wheel), or the combination thereof. The driving mechanism of the invention may comprise two or more than two types of driving devices for implementing different driving functions, wherein the driving device may be any conventional driving device and it will not be depicted herein.

According to the claimed invention, the driving device may comprise at least one driving module.

According to the claimed invention, the driving device may comprise at least one driving module, such as, but not limited to, two, three or four types of driving modules.

According to the claimed invention, a rotating shaft of each rotating plate is perpendicular or parallel to a plane when the powder gathering apparatus is disposed on the plane.

According to the claimed invention, the powder gathering apparatus further comprises at least two support bases, the at least two support bases are disposed with respect to each other, each of the rotating plates is disposed on one of the at least two support bases.

According to the claimed invention, each of the rotating plates comprises two plate bodies and the at least one spherical member is rotatably sandwiched in between the two plate bodies.

According to the claimed invention, each of the rotating plates comprises at least one fixing member and the at least one fixing member fixes the at least one spherical member on the rotating plate.

According to the claimed invention, a surface of the at least one spherical member is smooth or rough.

According to the claimed invention, each of the rotating plates comprises a plurality of rails and a plurality of spherical members and each of the rails comprises at least one of the spherical members.

According to the claimed invention, each of the rotating plates may further comprise at least one hole selectively.

According to the claimed invention, each of the rails may further comprise at least one hole selectively.

According to the claimed invention, at least one protruding surface of the spherical member of each rotating plate contacts a sample.

According to the claimed invention, the driving mechanism drives each of the rails to rotate clockwise or counterclockwise.

According to the claimed invention, rotating directions of the rails are identical or different.

According to the claimed invention, the rails are concentric rails.

According to the claimed invention, the rails are circular.

According to the claimed invention, the rails of the at least two rotating plates correspond to or are staggered with each other.

According to the claimed invention, the driving mechanism comprises a plurality of rollers and each of the rails is driven to rotate by at least two of the rollers.

According to the claimed invention, a material of the at least one spherical member is stainless steel, iron or zirconia.

According to the claimed invention, the powder gathering apparatus is configured to gather powders from a prepreg or a copper-free laminate.

According to the claimed invention, the powder gathering apparatus further comprises a hanging mechanism, the hanging mechanism is configured to hang a prepreg or a copper-free laminate between the at least two rotating plates.

According to the claimed invention, the powder gathering apparatus further comprises a sieve and a powder container, the sieve is disposed in the powder container, the powder container is disposed below the prepreg or the copper-free laminate.

According to the claimed invention, the powder gathering apparatus further comprises an air drawing mechanism, the air drawing mechanism being disposed in the powder container.

As mentioned in the above, the driving mechanism of the powder gathering apparatus of the invention can drive the rotating plates to get close to each other, so as to clamp the prepreg or the copper-free laminate between the rotating plates. Then, the driving mechanism can drive the rotating plates to rotate, such that the spherical members of the rotating plates rub the prepreg or the copper-free laminate to obtain powders from the prepreg or the copper-free laminate. Accordingly, the powder gathering apparatus of the invention can gather powders from the prepreg or the copper-free laminate automatically and efficiently. Therefore, the invention can save manpower effectively and gather powders efficiently.

These and other objectives of the present invention will no doubt become obvious to those of ordinary skill in the art after reading the following detailed description of the preferred embodiment that is illustrated in the various figures and drawings.

DETAILED DESCRIPTION

In the invention, the term "a" or "an" is employed to describe elements and components described herein. This is done merely for convenience and to give a general sense of the scope of the invention. This description should be read to include one or at least one and the singular also includes the plural unless it is obvious that it is meant otherwise.

In the description, the term "comprise", "include", "have" and any variations thereof are intended to cover a non-exclusive inclusion, such that a component, structure, product, or apparatus that comprises a list of elements is not necessarily limited to those elements, but may include other elements not expressly listed or inherent to such component, structure, product, or apparatus. Further, unless expressly stated to the contrary, "or" refers to an inclusive "or" and not to an exclusive "or".

Figure 1:
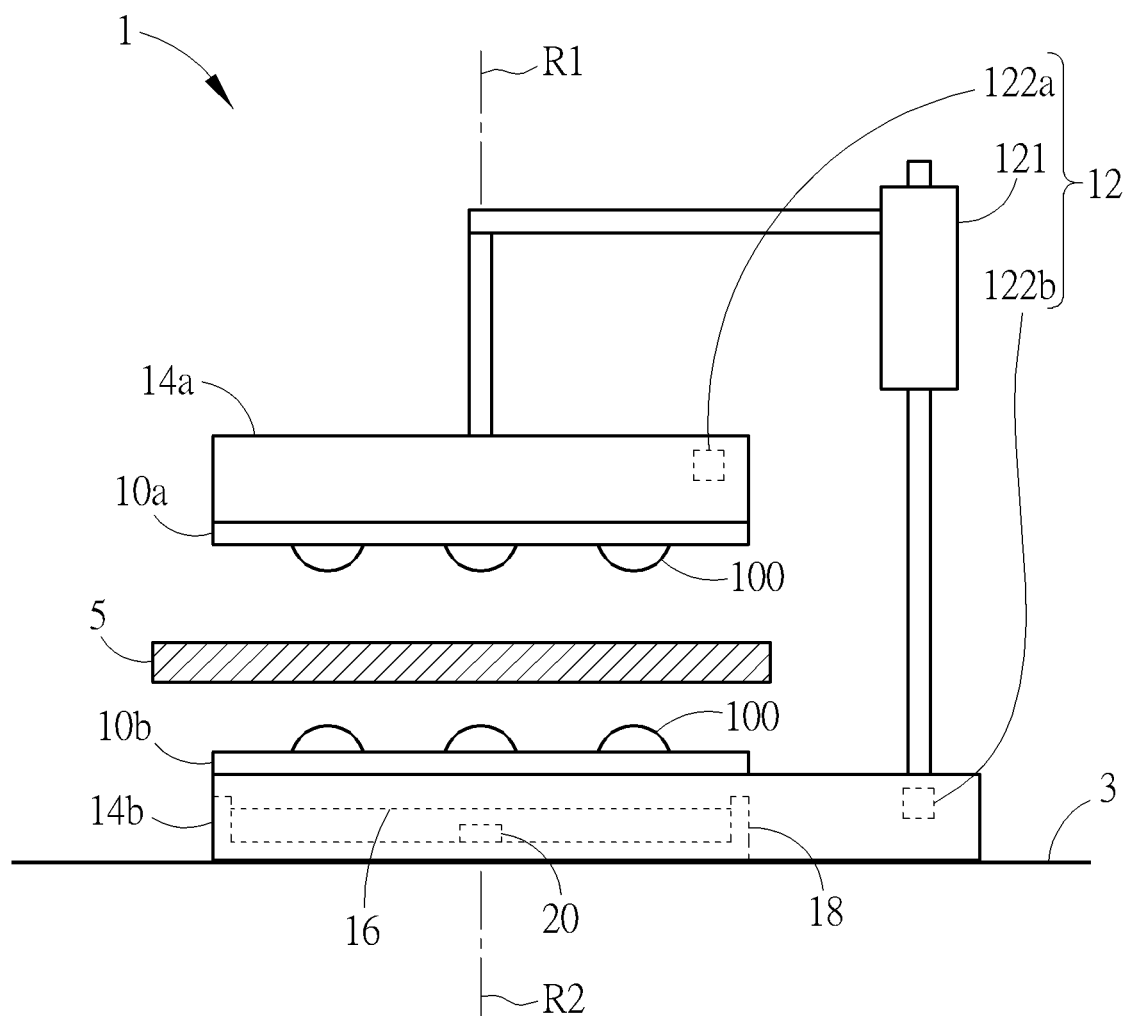
FIG. 1 is a schematic view illustrating a powder gathering apparatus according to an embodiment of the invention, wherein two rotating plates get away from each other.
Figure 2:
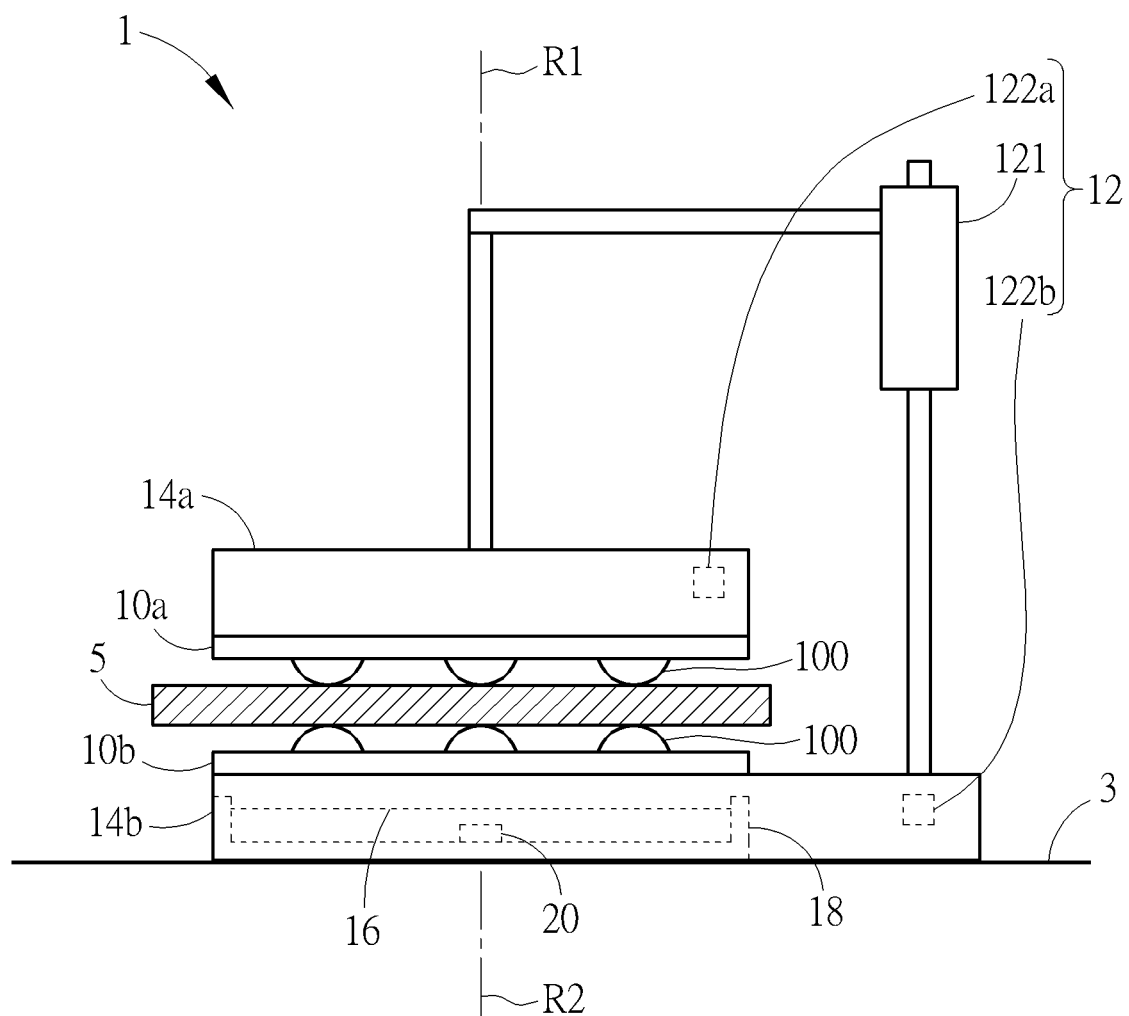
FIG. 2 is a schematic view illustrating the rotating plates shown in FIG. 1 getting close to each other.
Figure 3:
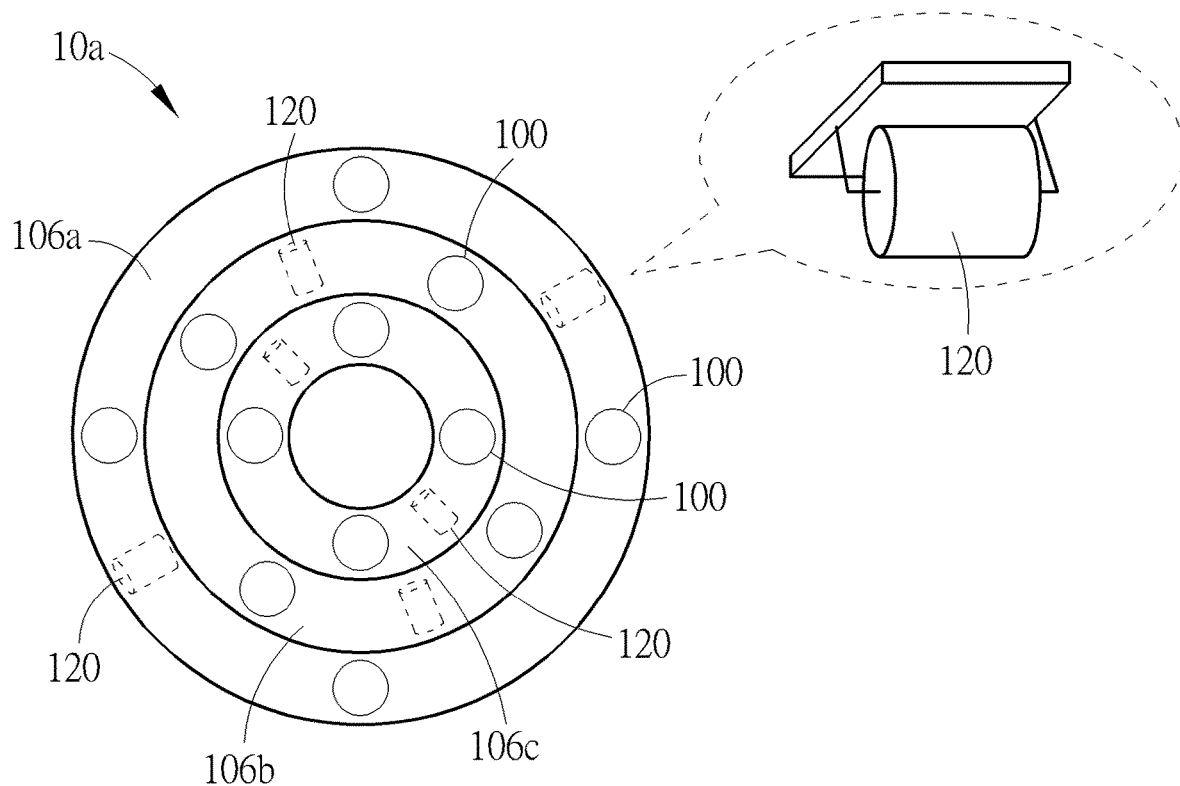
FIG. 3 is a top view illustrating the rotating plates shown in FIG. 1.
Figure 3:
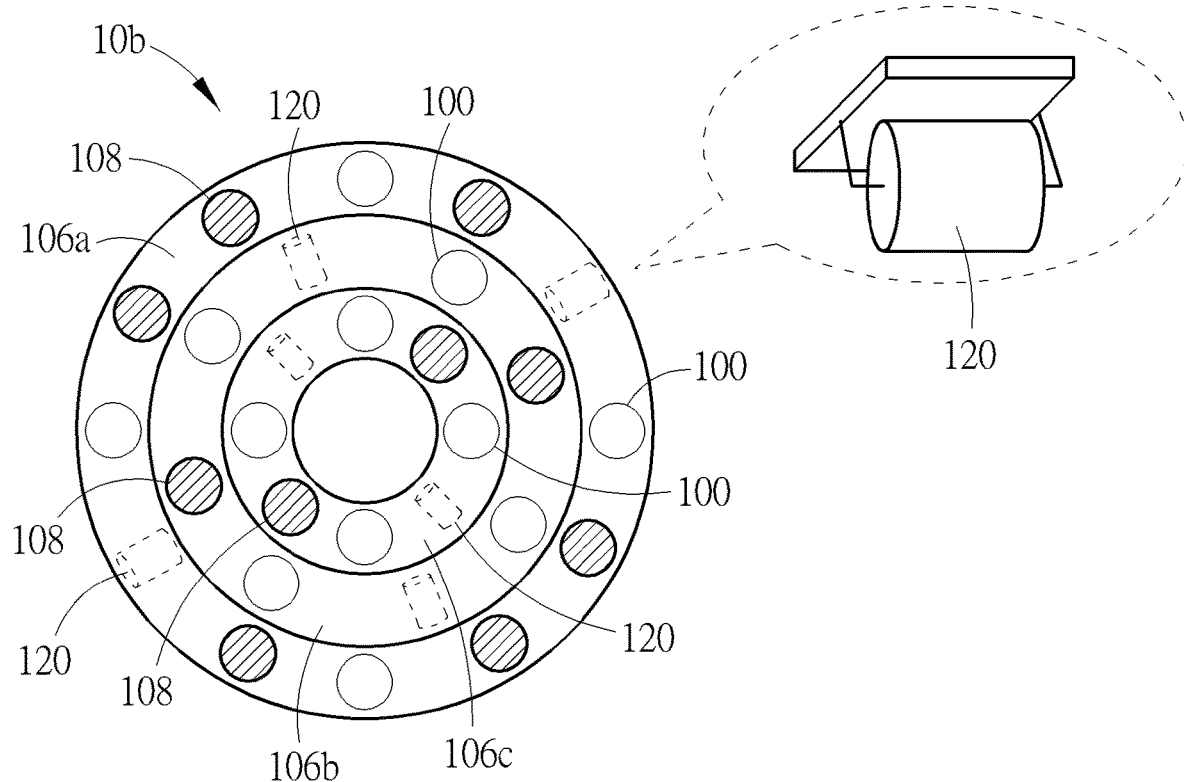
Figure 4:
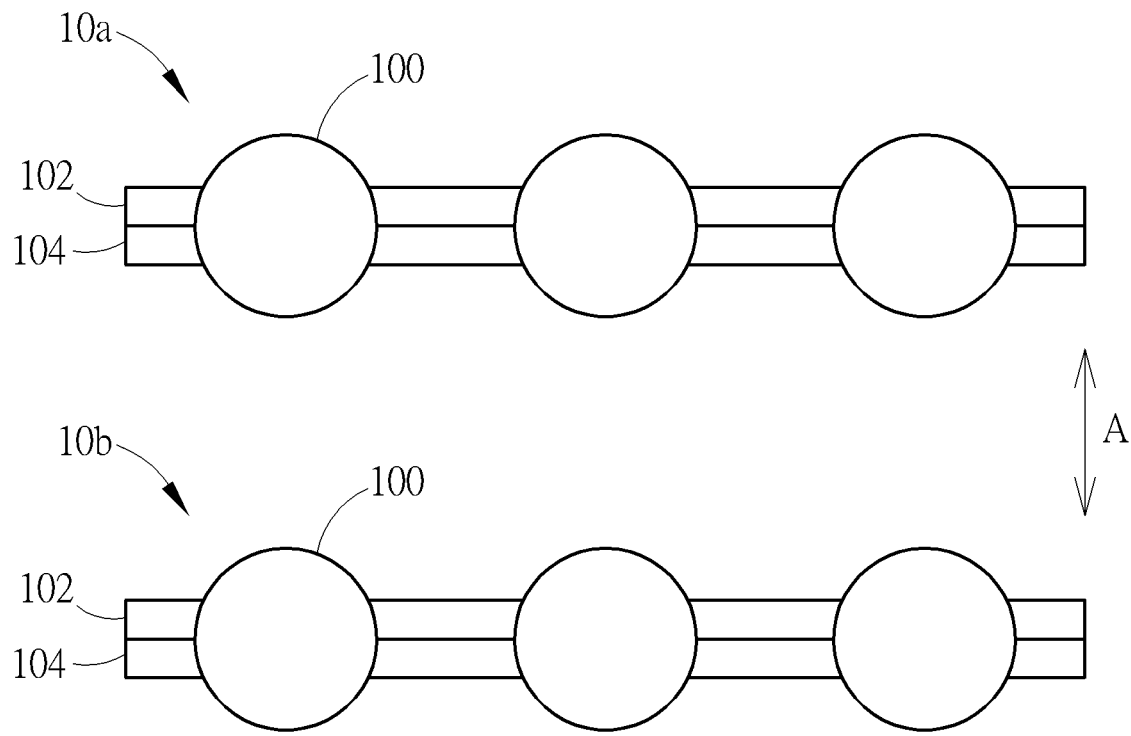
FIG. 4 is a side view illustrating the rotating plates shown in FIG. 1.

Referring to FIGS. 1 to 4, FIG. 1 is a schematic view illustrating a powder gathering apparatus 1 according to an embodiment of the invention, wherein two rotating plates 10a, 10b get away from each other, FIG. 2 is a schematic view illustrating the rotating plates 10a, 10b shown in FIG. 1 getting close to each other, FIG. 3 is a top view illustrating the rotating plates 10a, 10b shown in FIG. 1, and FIG. 4 is a side view illustrating the rotating plates 10a, 10b shown in FIG. 1.

As shown in FIG. 1, the powder gathering apparatus 1 comprises at least two rotating plates 10a, 10b, a driving mechanism 12, at least two support bases 14a, 14b, a sieve 16, a powder container 18 and an air drawing mechanism 20. It should be noted that FIGS. 1 and 2 illustrate two rotating plates and two support bases for describing the features of the invention and the invention is not limited to the embodiment. The invention may dispose more than two rotating plates and more than two support bases according to practical applications.

The support bases 14a, 14b are disposed with respect to each other and each of the rotating plates 10a, 10b is disposed on one of the support bases 14a, 14b, such that the rotating plates 10a, 10b are disposed with respect to each other. As shown in FIG. 1, the rotating plate 10a is disposed on the support base 14a and the rotating plate 10b is disposed on the support base 14b. In this embodiment, the rotating plates 10a, 10b are disposed at upper and lower positions with respect to each other. In other words, when the powder gathering apparatus 1 is disposed on a plane 3, the rotating shafts R1, R2 of the rotating plates 10a, 10b are perpendicular to the plane 3.

Each of the rotating plates 10a, 10b comprises at least one spherical member 100 and the spherical member 100 protrudes from the rotating plates 10a, 10b. It should be noted that the number of the spherical members 100 may be determined according to practical applications and the invention is not limited to the embodiment shown in the figure. A material of the spherical member 100 may be, but not limited to, stainless steel, iron or zirconia. Furthermore, a surface of the spherical member 100 may be smooth or rough according to practical applications. As shown in FIG. 4, each of the rotating plates 10a, 10b may comprise two plate bodies 102, 104. In this embodiment, the plate bodies 102, 104 may be connected to or separated from each other in a direction indicated by double headed arrow A, such that the spherical member 100 is rotatably sandwiched in between the plate bodies 102, 104.

As shown in FIG. 3, each of the rotating plates 10a, 10b may comprise a plurality of rails 106a, 106b, 106c and a plurality of spherical members 100, and each of the rails 106a, 106b, 106c comprises at least one spherical member 100. It should be noted that FIG. 3 illustrates three rails for describing the features of the invention and the invention is not limited to the embodiment. The invention may dispose one or more rails according to practical applications. Still further, the number of the spherical members disposed on each rail may be determined according to practical applications. In this embodiment, the rails 106a, 106b, 106c of the rotating plates 10a, 10b correspond to each other, such that the spherical members 100 of the rotating plates 10a, 10b also correspond to each other. In another embodiment, the rails 106a, 106b, 106c of the rotating plates 10a, 10b may be staggered with each other, such that the spherical members 100 of the rotating plates 10a, 10b may also be staggered with each other.

In this embodiment, the driving mechanism 12 may comprise two driving modules 122a, 122b, wherein the driving module 122a is configured to drive each of the rails 106a, 106b, 106c of the rotating plate 10a to rotate clockwise or counterclockwise, the driving module 122b is configured to drive each of the rails 106a, 106b, 106c of the rotating plate 10b to rotate clockwise or counterclockwise, and the rotating directions of the rails 106a, 106b, 106c may be identical or different. In an embodiment, the rails 106a, 106b, 106c may rotate clockwise. In another embodiment, the rails 106a, 106b, 106c may rotate counterclockwise. In another embodiment, the rails 106a, 106c may rotate clockwise and the rail 106b may rotate counterclockwise. In another embodiment, the rails 106a, 106c may rotate counterclockwise and the rail 106b may rotate clockwise. In this embodiment, each of the driving modules 122a, 122b of the driving mechanism 12 may comprise a plurality of rollers 120 and each of the rails 106a, 106b, 106c is driven to rotate by at least two rollers 120. As shown in FIG. 3, the rollers 120 may be disposed at the back of the rotating plates 10a, 10b and the driving modules 122a, 122b may drive the rollers 120 to rotate by a motor or other transmitting devices, so as to drive the rails 106a, 106b, 106c to rotate. Furthermore, the driving modules 122a, 122b may use a control unit to control the rollers 120 to rotate in wireless manner, so as to drive the rails 106a, 106b, 106c to rotate. Still further, the invention may use a button cell battery to be a power supply module of the roller 120, wherein the power supply module may supply power for a driving motor of the roller 120 to drive the roller 120 to rotate, so as to drive the rails 106a, 106b, 106c to rotate. Moreover, the invention may drive the rails 106a, 106b, 106c to rotate by conventional magnetic-levitated control technology.

The route of the aforesaid rollers 120 may be controlled by conventional manner. For example, the rollers 120 may be disposed on another set of rails and move along the rails, but is not so limited. The route of the rails may be circular, such as, but not limited to, a circle. In an embodiment, the aforesaid rollers may move on another set of circular rails. Different rollers 120 may move on different circular rails with different sizes and the circular rails may be concentric rails.

In this embodiment, the rails 106a, 106b, 106c may be concentric rails. In another embodiment, the rails 106a, 106b, 106c may form one or more concentric circles according to practical applications. Furthermore, the rails 106a, 106b, 106c may be circular, such as circle, ellipse, plum-shaped, other regular shapes or irregular shapes.

The driving mechanism 12 may further comprise a driving module 121, wherein the driving module 121 is configured to drive at least one of the rotating plates 10a, 10b to move, such that the rotating plates 10a, 10b get close to or away from each other. As shown in FIGS. 1 and 2, the driving module 121 of the driving mechanism 12 may drive the rotating plate 10a to move upward and downward, such that the rotating plates 10a, 10b get close to or away from each other. Furthermore, the driving modules 122a, 122b of the driving mechanism 12 may drive the rotating plates 10a, 10b to rotate.

In this embodiment, the driving mechanism 12 comprises at least one component capable of implementing the aforesaid function, such as, but not limited to, control unit, control rod, motor, gear, driving belt, roller, or the combination thereof. The driving mechanism 12 of the invention may comprise two or more than two types of driving devices for implementing different driving functions, wherein the driving device may be any conventional driving device and it will not be depicted herein.

The powder gathering apparatus 1 of the invention is configured to gather powders from a prepreg or a copper-free laminate. It should be noted that FIGS. 1 and 2 illustrate a sample 5 to represent the prepreg or the copper-free laminate. First, when the rotating plates 10a, 10b are away from each other, an operator may hold and place the sample 5 between the rotating plates 10a, 10b, as shown in FIG. 1. Then, the operator may control the driving module 121 of the driving mechanism 12 to drive the support base 14a and the rotating plate 10a to move downward, such that the rotating plates 10a, 10b get close to each other and the sample 5 is sandwiched in between the rotating plates 10a, 10b, as shown in FIG. 2. At this time, at least one protruding surface of the spherical member 100 of each rotating plate 10a, 10b contacts the sample 5. Then, the operator may control the driving modules 122a, 122b of the driving mechanism 12 to drive the rails 106a, 106b, 106c of the rotating plates 10a, 10b to rotate, such that the spherical members 100 of the rotating plates 10a, 10b rub the sample 5, so as to obtain powders from the sample 5. After gathering powders, the operator may control the driving module 121 of the driving mechanism 12 to drive the support base 14a and the rotating plate 10a to move upward, such that the rotating plates 10a, 10b get away from each other, as shown in FIG. 1. Then, the operator may remove the sample 5 and place another sample 5 between the rotating plates 10a, 10b. It should be noted that the control principle of the aforesaid driving modules 121, 122a, 122b of the driving mechanism 12 may be implemented by conventional electromechanical technology, so it will not be depicted herein.

In an embodiment of the invention, the aforesaid sample 5 may be a prepreg. In another embodiment of the invention, the aforesaid sample 5 may be a copper-free laminate.

As shown in FIGS. 1 and 2, the sieve 16 is disposed in the powder container 18, the powder container 18 is disposed below the prepreg or the copper-free laminate (i.e. the sample 5), and the air drawing mechanism 20 is disposed in the powder container 18. In this embodiment, the powder container 18 may be disposed in the support base 14b. Furthermore, as shown in FIG. 3, the rotating plate 10b comprises a plurality of holes 108. Accordingly, the powders coming off the sample 5 will pass through the holes 108 and then enter the powder container 18. The sieve 16 can filter the powders to remove impurities (e.g. broken fiber fabric). In practical applications, the sieve 16 may have different meshes, wherein the meshes may be between 20 and 100 and, preferably, may be between 20 and 60. The powder container 18 may be drawn out from the support base 14b, so as to take out the powders from the powder container 18 for inspection. The air drawing mechanism 20 may be an air drawing motor device configured to provide an active airflow, so as to draw the powders into the powder container 18 effectively.

In this embodiment, when the rotating plates 10a, 10b are rotating, the abrasion rate of the spherical member 100 can be reduced since the spherical member 100 can rotate with respect to the rotating plates 10a, 10b. Furthermore, when the rotation directions of two adjacent rails are reversed, the efficiency of gathering powders from the prepreg or the copper-free laminate can be further enhanced.

Figure 5:
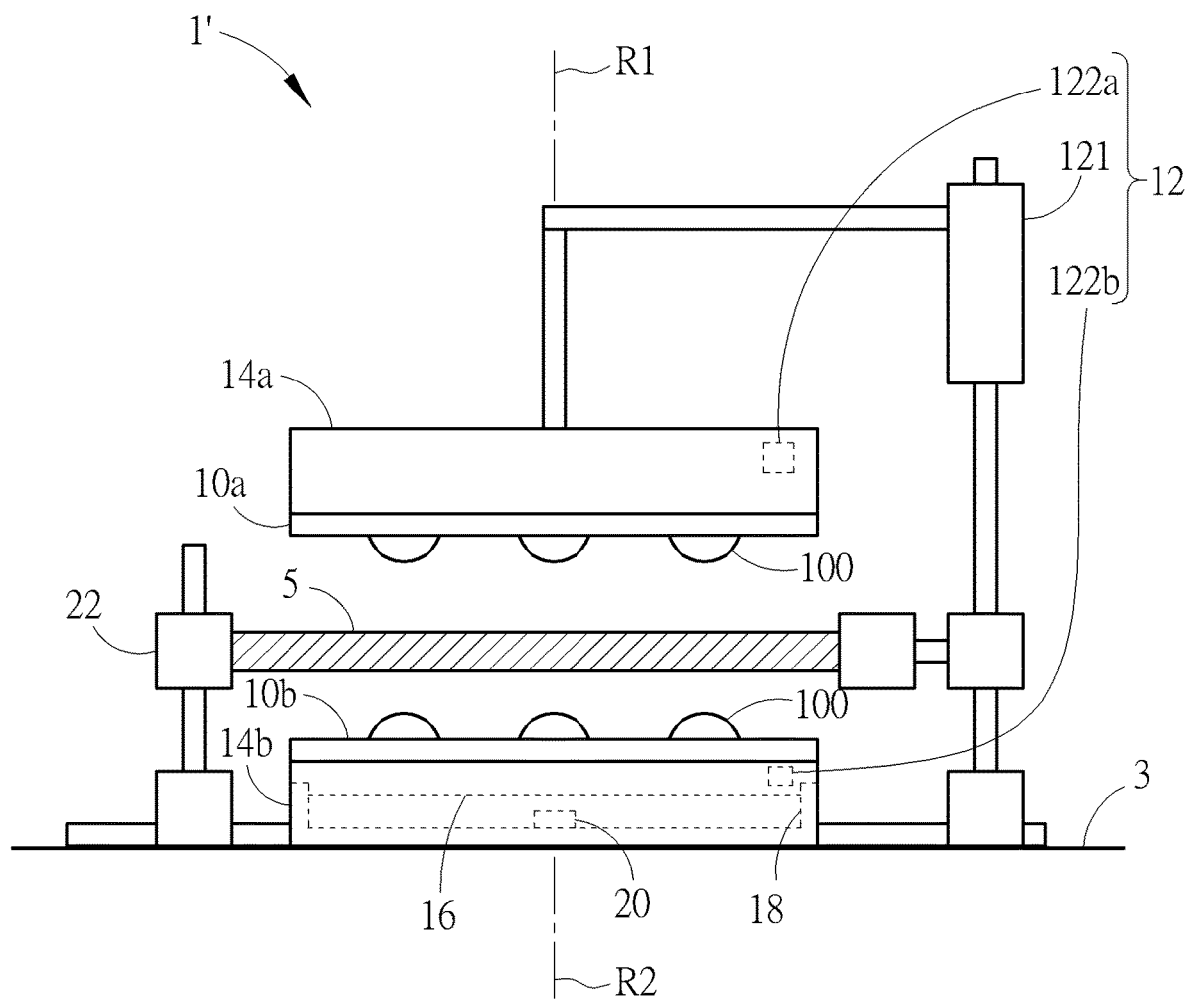
FIG. 5 is schematic view illustrating a powder gathering apparatus according to another embodiment of the invention.

Referring to FIG. 5, FIG. 5 is schematic view illustrating a powder gathering apparatus 1' according to another embodiment of the invention. The main difference between the powder gathering apparatus 1' and the aforesaid powder gathering apparatus 1 is that the powder gathering apparatus 1' further comprises a hanging mechanism 22. As shown in FIG. 5, the hanging mechanism 22 is configured to hang the prepreg or the copper-free laminate (i.e. the sample 5) between the rotating plates 10a, 10b. Accordingly, the operator need not hold the sample 5 between the rotating plates 10a, 10b.

Figure 6:
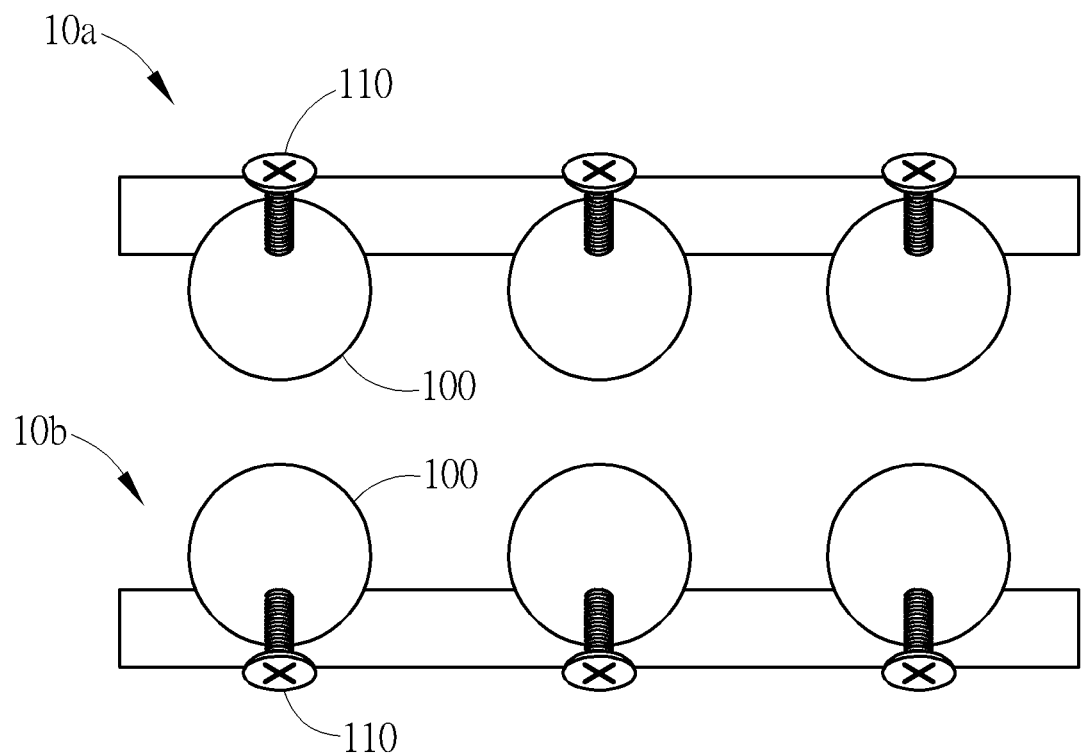
FIG. 6 is a side view illustrating the rotating plates according to another embodiment of the invention.

Referring to FIG. 6, FIG. 6 is a side view illustrating the rotating plates 10a, 10b according to another embodiment of the invention. As shown in FIG. 6, each of the rotating plates 10a, 10b may comprise at least one fixing member 110, wherein the fixing member 110 is configured to fix the spherical member 100 on the rotating plates 10a, 10b. In this embodiment, the fixing member 110 may be a screw or other fixing members. When the rotating plates 10a, 10b are rotating, the efficiency of gathering powders can be enhanced since the spherical members 100 are fixed with respect to the rotating plates 10a, 10b.

Figure 7:
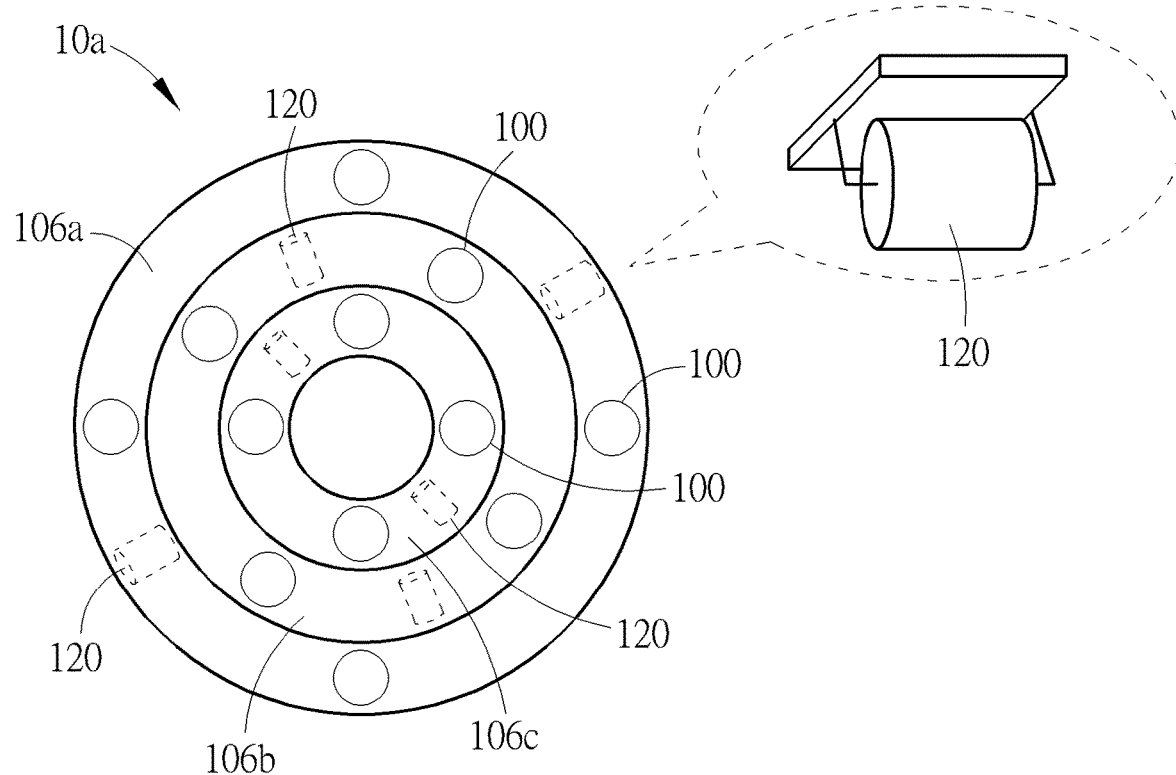
FIG. 7 is a top view illustrating the rotating plates according to another embodiment of the invention.
Figure 7:
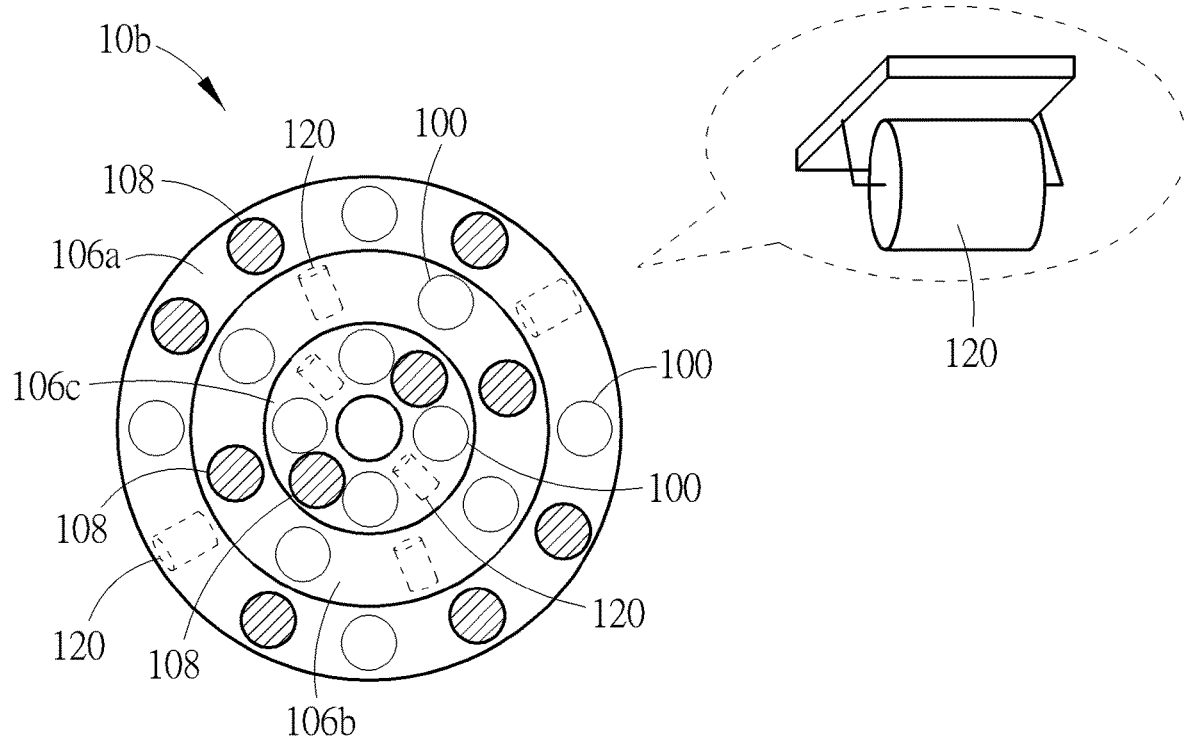
Figure 8:
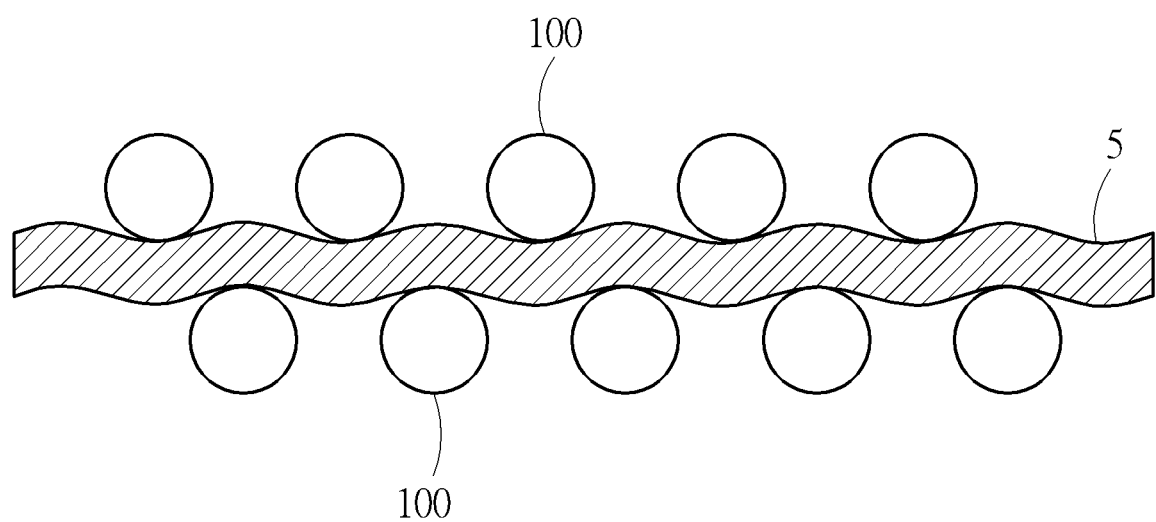
FIG. 8 is a side view illustrating the spherical members of the rotating plates shown in FIG. 7 being staggered with each other.

Referring to FIGS. 7 and 8, FIG. 7 is a top view illustrating the rotating plates 10a, 10b according to another embodiment of the invention and FIG. 8 is a side view illustrating the spherical members 100 of the rotating plates 10a, 10b shown in FIG. 7 being staggered with each other. In this embodiment, the rails 106a, 106b, 106c of the rotating plates 10a, 10b may be staggered with each other, such that the spherical members 100 of the rotating plates 10a, 10b are also staggered with each other, as shown in FIGS. 7 and 8. For example, the radii of the rails 106a, 106b, 106c of the rotating plate 10a may be larger than the radii of the rails 106a, 106b, 106c of the rotating plate 10b, such that the spherical members 100 of the rotating plates 10a, 10b are staggered with each other (as shown in FIG. 8) while the aforesaid sample 5 is sandwiched in between the rotating plates 10a, 10b. Accordingly, the contact areas between the spherical members 100 and the prepreg or the copper-free laminate (i.e. the sample 5) can be increased, so as to enhance the efficiency of gathering powders. It should be noted that the radii of the rails 106a, 106b, 106c of the rotating plate 10a may also be smaller than the radii of the rails 106a, 106b, 106c of the rotating plate 10b according to practical applications.

Figure 9:
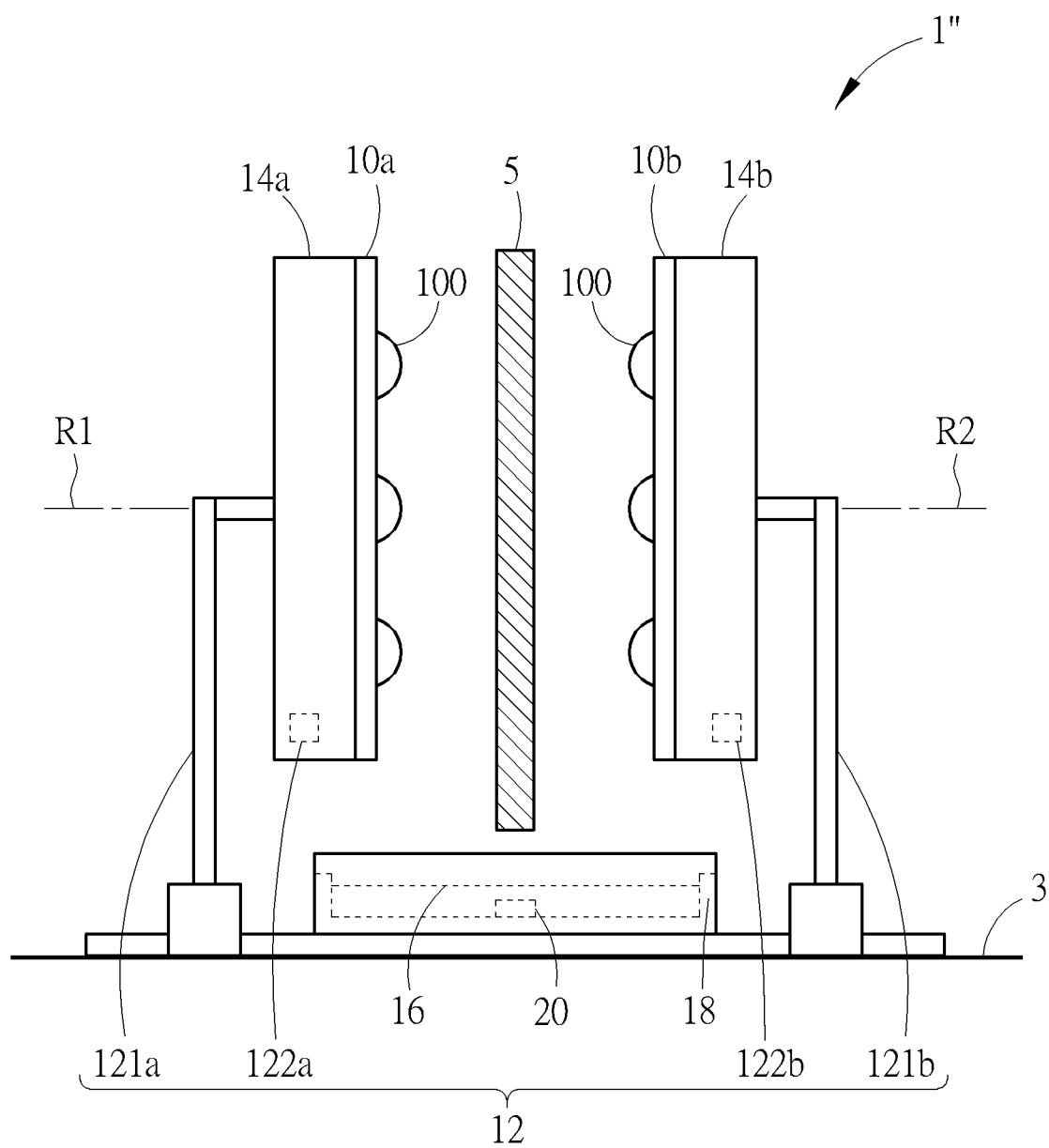
FIG. 9 is a schematic view illustrating a powder gathering apparatus according to another embodiment of the invention, wherein two rotating plates get away from each other.
Figure 10:
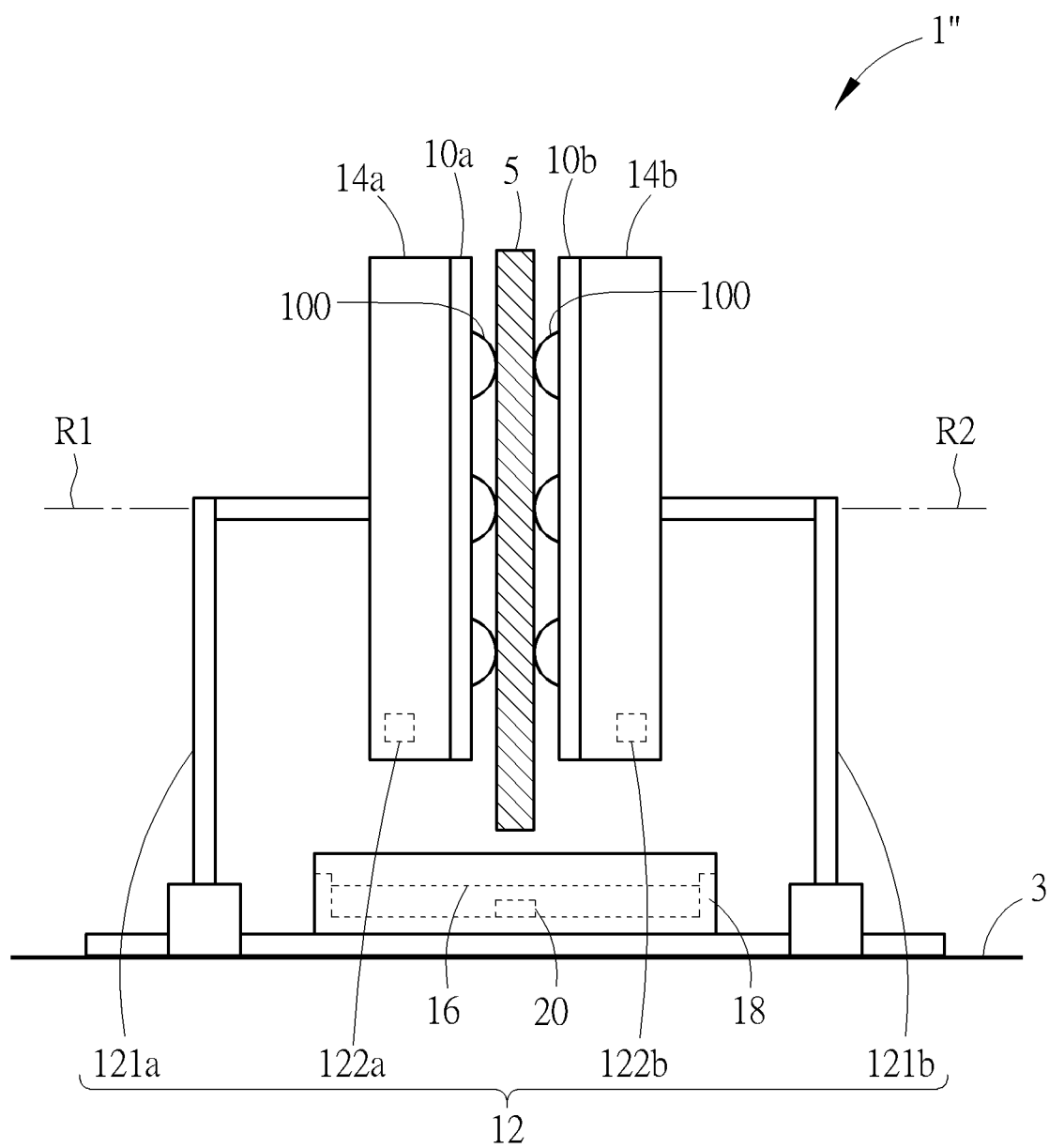
FIG. 10 is a schematic view illustrating the rotating plates shown in FIG. 9 getting close to each other.

As shown in FIGS. 9 and 10, FIG. 9 is a schematic view illustrating a powder gathering apparatus 1" according to another embodiment of the invention, wherein two rotating plates 10a, 10b get away from each other, and FIG. 10 is a schematic view illustrating the rotating plates 10a, 10b shown in FIG. 9 getting close to each other. The main difference between the powder gathering apparatus 1" and the aforesaid powder gathering apparatus 1 is that the rotating plates 10a, 10b and the support bases 14a, 14b of the powder gathering apparatus 1" are disposed at left and right positions with respect to each other. In other words, when the powder gathering apparatus 1" is disposed on a plane 3, the rotating shafts R1, R2 of the rotating plates 10a, 10b are parallel to the plane 3, as shown in FIG. 9. In this embodiment, the rotating plate 10b may not comprise the holes 108 shown in FIG. 3. Compared to the aforesaid powder gathering apparatus 1, the powder gathering apparatus 1" can prevent the powders of the prepreg or the copper-free laminate (i.e. the sample 5) from stuffing the gap between the rotating plate and the spherical member, resulting in malfunction of the apparatus.

The driving mechanism 12 may comprise two driving modules 121a, 121b, wherein the driving module 121a is configured to drive the rotating plate 10a to move and the driving module 121b is configured to drive the rotating plate 10b to move, such that the rotating plates 10a, 10b get close to or away from each other. As shown in FIGS. 9 and 10, the driving modules 121a, 121b of the driving mechanism 12 may drive the rotating plates 10a, 10b to move rightward and leftward, such that the rotating plates 10a, 10b get close to or away from each other. Furthermore, the driving modules 122a, 122b of the driving mechanism 12 may drive the rotating plates 10a, 10b to rotate. Moreover, the powder container 18 may be disposed below the rotating plates 10a, 10b.

The powder gathering apparatus 1" of the invention is configured to gather powders from a prepreg or a copper-free laminate. It should be noted that FIGS. 9 and 10 illustrate a sample 5 to represent the prepreg or the copper-free laminate. First, when the rotating plates 10a, 10b are away from each other, an operator may hold and place the sample 5 between the rotating plates 10a, 10b, as shown in FIG. 9. Then, the operator may control the driving module 121a of the driving mechanism 12 to drive the support base 14a and the rotating plate 10a to move rightward and control the driving module 121b of the driving mechanism 12 to drive the support base 14b and the rotating plate 10b to move leftward, such that the rotating plates 10a, 10b get close to each other and the sample 5 is sandwiched in between the rotating plates 10a, 10b, as shown in FIG. 10. At this time, at least one protruding surface of the spherical member 100 of each rotating plate 10a, 10b contacts the sample 5. Then, the operator may control the driving modules 122a, 122b of the driving mechanism 12 to drive the rotating plates 10a, 10b to rotate, such that the spherical members 100 of the rotating plates 10a, 10b rub the sample 5, so as to obtain powders from the sample 5. After gathering powders, the operator may control the driving module 121a of the driving mechanism 12 to drive the support base 14a and the rotating plate 10a to move leftward and control the driving module 121b of the driving mechanism 12 to drive the support base 14b and the rotating plate 10b to move rightward, such that the rotating plates 10a, 10b get away from each other, as shown in FIG. 9. Then, the operator may remove the sample 5 and place another sample 5 between the rotating plates 10a, 10b. It should be noted that the control principle of the aforesaid driving modules 121a, 121b, 122a, 122b of the driving mechanism 12 may be implemented by conventional electromechanical technology, so it will not be depicted herein.

Figure 11:
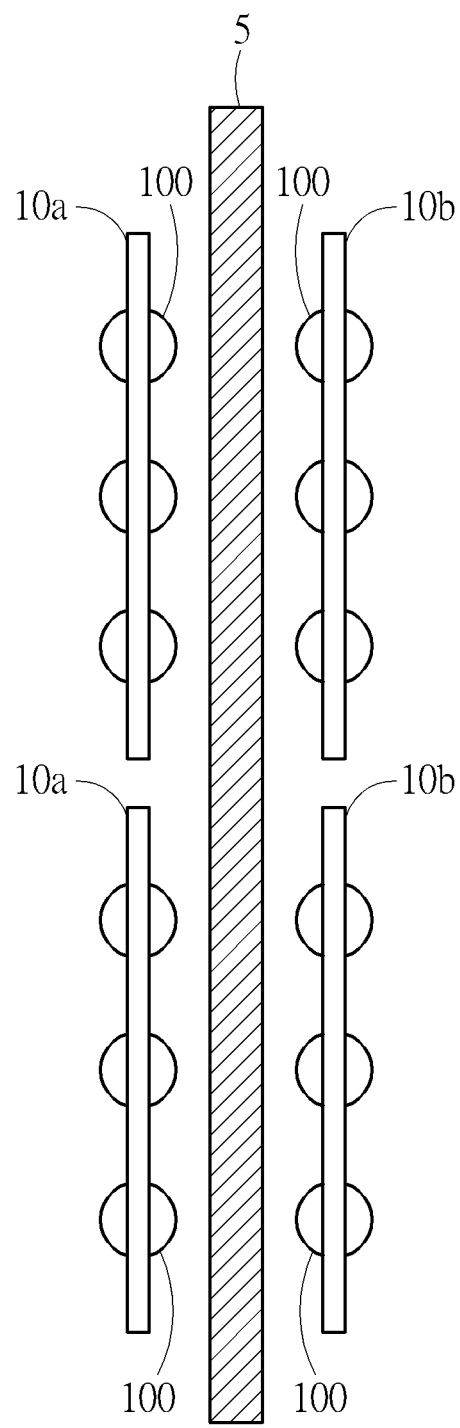
FIG. 11 is a top view illustrating four rotating plates according to another embodiment of the invention.

Referring to FIG. 11, FIG. 11 is a top view illustrating four rotating plates 10a, 10b according to another embodiment of the invention. In this embodiment, the invention may use four rotating plates 10a, 10b to gather powders from the prepreg or the copper-free laminate (i.e. the sample 5), so as to enhance the efficiency of gathering powders.

Figure 12:
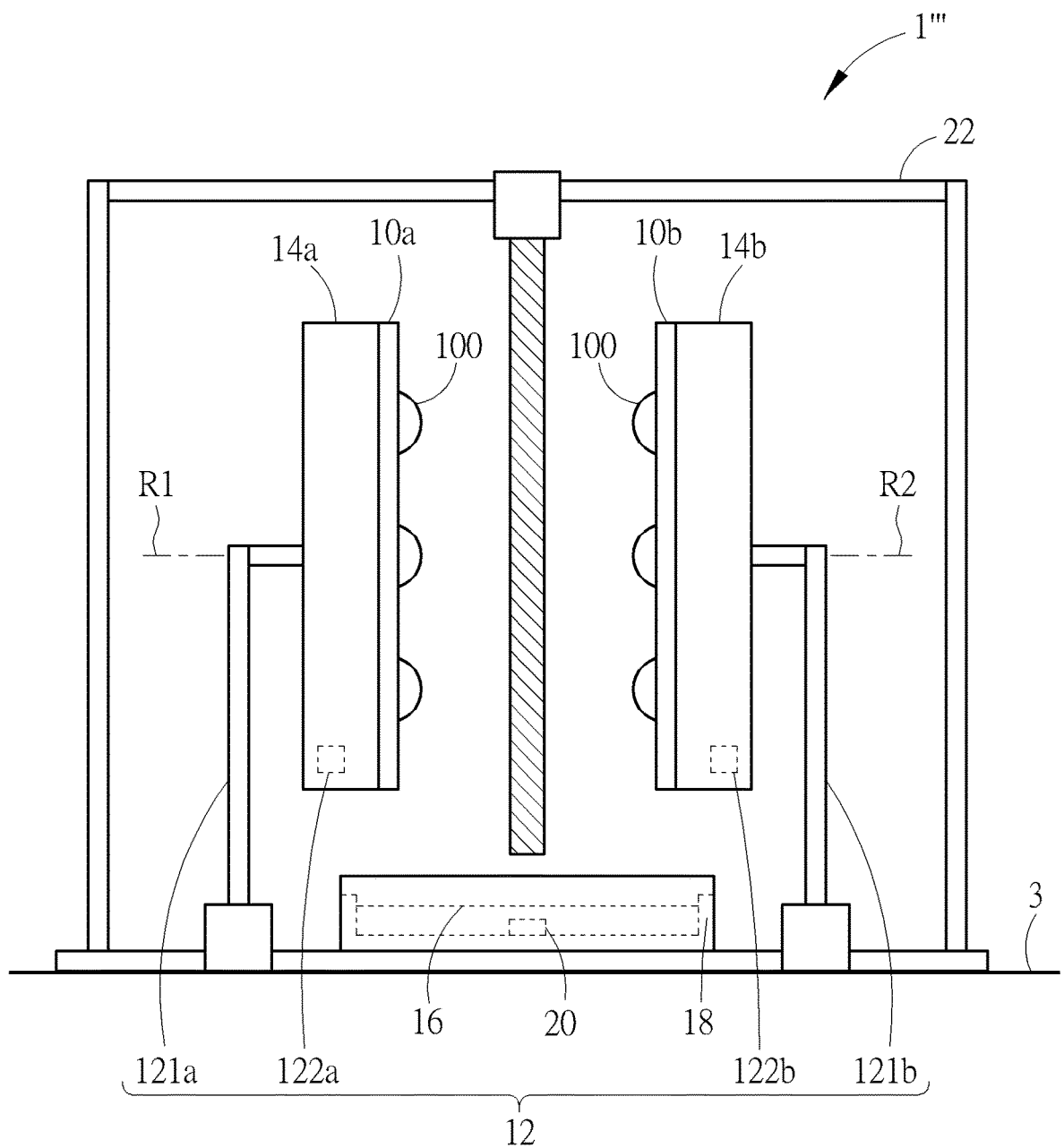
FIG. 12 is a schematic view illustrating a powder gathering apparatus according to another embodiment of the invention.

Referring to FIG. 12, FIG. 12 is a schematic view illustrating a powder gathering apparatus 1''' according to another embodiment of the invention. The main difference between the powder gathering apparatus 1''' and the aforesaid powder gathering apparatus 1" is that the powder gathering apparatus 1''' further comprises a hanging mechanism 22. As shown in FIG. 12, the hanging mechanism 22 is configured to hang the prepreg or the copper-free laminate (i.e. the sample 5) between the rotating plates 10a, 10b. Accordingly, the operator need not hold the sample 5 between the rotating plates 10a, 10b.

As mentioned in the above, the driving mechanism of the powder gathering apparatus of the invention can drive the rotating plates to get close to each other, so as to clamp the prepreg or the copper-free laminate between the rotating plates. Then, the driving mechanism can drive the rotating plates to rotate, such that the spherical members of the rotating plates rub the prepreg or the copper-free laminate to obtain powders from the prepreg or the copper-free laminate. Accordingly, the powder gathering apparatus of the invention can gather powders from the prepreg or the copper-free laminate automatically and efficiently. Therefore, the invention can save manpower effectively and gather powders efficiently.

It should be noted that the invention may also dispose acicular members on the rotating plates to gather powders from the prepreg or the copper-free laminate. However, when the acicular members rub the prepreg, the acicular members may break the prepreg, such that the rubbable area may decrease as the rubbing time increases. Accordingly, the invention uses the spherical members to gather powders from the prepreg or the copper-free laminate, so as to maintain the rubbable area and then enhance the efficiency of gathering powders. Furthermore, compared to the acicular member, the spherical member of the invention can be replaced much more easily.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A powder gathering apparatus comprising:
   at least two rotating plates disposed with respect to each other, each of the rotating plates comprising two plate bodies, a plurality of rails and a plurality of spherical members, the spherical members being rotatably sandwiched in between the two plate bodies and protruding from the rotating plate, each of the rails comprising at least one of the spherical members, the rails being concentric and circular rails with different sizes and arranged from inside to outside;
   a driving mechanism driving at least one of the at least two rotating plates to move, such that the at least two rotating plates get close to or away from each other, the driving mechanism driving the at least two rotating plates to rotate;
   a powder container disposed below a prepreg or a copper-free laminate between the at least two rotating plates; and
   a sieve disposed in the powder container, the sieve being located directly below and parallel to the at least two rotating plates.

2. The powder gathering apparatus of claim 1, wherein a rotating shaft of each rotating plate is perpendicular to a plane when the powder gathering apparatus is disposed on the plane.

3. The powder gathering apparatus of claim 1, further comprising at least two support bases, the at least two support bases being disposed with respect to each other, each of the rotating plates being disposed on one of the at least two support bases.

4. The powder gathering apparatus of claim 1, wherein each of the rotating plates comprises at least one fixing member and the at least one fixing member fixes the at least one spherical member on the rotating plate.

5. The powder gathering apparatus of claim 1, wherein the driving mechanism drives each of the rails to rotate clockwise.

6. The powder gathering apparatus of claim 5, wherein rotating directions of the rails are identical.

7. The powder gathering apparatus of claim 5, wherein rotating directions of the rails are different.

8. The powder gathering apparatus of claim 1, wherein the driving mechanism drives each of the rails to rotate counterclockwise.

9. The powder gathering apparatus of claim 8, wherein rotating directions of the rails are identical.

10. The powder gathering apparatus of claim 8, wherein rotating directions of the rails are different.

11. The powder gathering apparatus of claim 1, wherein the rails of the at least two rotating plates correspond to or are staggered with each other.

12. The powder gathering apparatus of claim 1, wherein the driving mechanism comprises a plurality of rollers and each of the rails is driven to rotate by at least two of the rollers.

13. The powder gathering apparatus of claim 1, wherein a material of the at least one spherical member is stainless steel, iron or zirconia.

14. The powder gathering apparatus of claim 1, configured to gather powders from the prepreg or the copper free laminate.

15. The powder gathering apparatus of claim 1, further comprising a hanging mechanism, the hanging mechanism being configured to hang the prepreg or the copper-free laminate between the at least two rotating plates.

16. The powder gathering apparatus of claim 1, further comprising an air drawing mechanism, the air drawing mechanism being disposed in the powder container.

* * * * *